United States Patent
Hsieh et al.

(10) Patent No.: US 8,248,113 B2
(45) Date of Patent: Aug. 21, 2012

(54) METHOD AND APPARATUS FOR ACCURATE CLOCK SYNTHESIS

(75) Inventors: Hong-Yean Hsieh, Santa Clara, CA (US); Chia-Liang (Leon) Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 82 days.

(21) Appl. No.: 12/861,067

(22) Filed: Aug. 23, 2010

(65) Prior Publication Data

US 2012/0044000 A1    Feb. 23, 2012

(51) Int. Cl.
*H03B 21/00* (2006.01)
(52) U.S. Cl. ........................ 327/105; 327/106
(58) Field of Classification Search .............. 327/105, 327/106
See application file for complete search history.

(56) References Cited

U.S. PATENT DOCUMENTS

| 7,764,131 | B1* | 7/2010 | Seth et al. .................. 331/46 |
| 2007/0176705 | A1* | 8/2007 | Sutardja ...................... 331/176 |

* cited by examiner

*Primary Examiner* — John Poos
(74) *Attorney, Agent, or Firm* — Thomas, Kayden, Horstemeyer & Risley, LLP

(57) ABSTRACT

Methods and apparatus are provided in the present invention to adjust the frequency of an output clock close to within a required accuracy of an oscillation frequency. In another embodiment, a method comprises: entering a calibration mode; generating a first control word to control a timing of a clock synthesizer; adjusting the first control word until the timing of the clock synthesizer is sufficiently accurate with respect to a timing of a reference clock; sensing a temperature using a temperature sensor; storing a present value of an output of the temperature sensor and the first control word into a non-volatile memory; exiting the calibration mode; entering a normal operation mode; sensing the temperature using the temperature sensor; generating a second control word to control the timing of the clock synthesizer in accordance with an output of the non-volatile memory and the output of the temperature sensor.

20 Claims, 8 Drawing Sheets

METHOD AND APPARATUS FOR ACCURATE CLOCK SYNTHESIS

BACKGROUND OF THE INVENTION

1. Field of the Invention

The present invention relates generally to electrical circuits, and more particularly to circuit elements for generating a clock to within the required accuracies of a frequency.

2. Description of the Background Art

An accurate clock is often generated by a crystal oscillator. Other clocks are then generated from this accurate clock. However, the size of the crystal oscillator can be bulky. In most of the portable products, the size of the product needs to be minimized. Furthermore, the cost of a crystal oscillator is relatively expensive if the oscillation frequency of the crystal oscillator is high. In contrast, the size of a clock generator built upon the very large scaled integrated circuits is small and can be very cost effective. The challenge lies on how to maintain frequency accuracy over process, voltage, and temperature (PVT) variations.

A periodic signal such as a clock can be generated by oscillators in the very large scaled integrated circuits, which can be either a ring oscillator or a LC-tank oscillator. In general, the type of LC-tank oscillators shows less frequency changes over PVT variations than the type of ring oscillators does. The oscillation frequency of both types of oscillators can be adjusted by changing the capacitances of their tuning circuit elements whose capacitances depend on the values of the associated control signals. The tuning circuit elements can be a variety of components and circuits, such as transistors or varactors. The capacitance of a tuning circuit element can be changed in a digital way or in an analog way. When tuned in a digital way, the control input of a tuning circuit element, being a binary one or a binary zero, enables or disables the tuning circuit element, respectively, to exhibit a larger capacitance or a smaller capacitance. When tuned in an analog way, the value of the control input of a tuning circuit element, being an analog voltage, determines the capacitance of the tuning circuit element.

To generate an oscillator's clock to within the required accuracies of a specified frequency against PVT variations, the frequency of the oscillator's clock can be measured for each operation point over PVT corners and then be adjusted by its tuning circuit elements accordingly. However, this process requires multi-point calibrations, which might be impractical in terms of the testing cost.

The frequency of the accurate clock is adjusted to the specified frequency at a known supply voltage and a known temperature during a one-point calibration. After the one-point calibration, the frequency changes of the accurate clock from the specified frequency due to process variations are eliminated to a negligibly small amount. However, the frequency of the accurate clock is only accurate at the known supply voltage and temperature. As the supply voltage and on-chip temperature change, the frequency of the accurate clock can deviate from the specified frequency.

To maintain the frequency accuracy against the variations of the on-chip temperature, a temperature sensor is employed to measure the on-chip temperature. The measured temperature is coupled to the input of a temperature compensated frequency controller, which estimates the frequency change of an accurate clock as the temperature changes. The frequency of the accurate clock can be adjusted by two methods. The first method is to change the capacitances of oscillators' tuning circuit elements. The second method is to use a fractional-N phase-locked loop, and then adjust the frequency of its output clock by changing its associated fractional control word. It is well known that the frequency of the output clock of a fractional-N phase-locked loop is equal to the multiplication of the frequency of its input clock and the value of the fractional control word. Therefore, adjusting the value of the fractional control word can change the frequency of the output clock. The output clock is then the accurate clock.

To maintain the frequency accuracy against the variations of the supply voltage, a linear regulator is usually employed to maintain the same supply voltage as the known supply voltage used during the one-point calibration. To further minimize the frequency changes, a digitally controlled oscillator can be employed. The digitally controlled oscillator employs digitally controlled tuning circuit elements. A digitally controlled tuning circuit element is enabled and disabled by setting its binary control signal to a binary one and a binary zero, respectively. Because of the binary nature of the control signal, the oscillation frequency of the digitally controlled oscillator is quite insensitive to the variations of the supply voltage.

SUMMARY

The present invention pertains to generate a clock to within the required accuracies of a specified frequency.

Methods and apparatus are provided in the present invention to adjust the frequency of an output clock close to within a required accuracy of an oscillation frequency. Methods and apparatus are also provided in the present invention to synthesize a clock to within the required accuracies of a frequency. In the present invention, a one-point calibration and a temperature compensated scheme are proposed to maintain the frequency of an accurate clock to within the required accuracies of the specified frequency over process, voltage, and temperature variations.

In one embodiment, an apparatus comprises: a clock synthesizer for outputting a first clock in accordance with a first control word during an initial calibration and outputting a second clock in accordance with a combination of a third control word and a fourth control word during a normal operation; a temperature sensor for outputting a second control word representing a temperature of the apparatus; a non-volatile memory for storing and outputting the third control word; a temperature compensated frequency controller for receiving the second control word and the third control word and outputting the fourth control word; and a one-point calibration controller for outputting the first control word, wherein: during the calibration period, the one-point calibration controller adjusts the first control word until a timing of the first clock is sufficiently accurate with respect to a timing of a reference clock, and upon the first clock being sufficiently accurate the calibration controller stores a present value of the first control word and the second control word into the non-volatile as the third control word; and during the normal operation, the one-point calibration controller is disabled, the non-volatile memory is in a read-only state, and the temperature compensated frequency controller adjusts the fourth control word in response to a change in the second control word. The calibration is said to be one-point, because the calibration only applies to a particular temperature representing the temperature at the moment when the clock synthesizer has been adjusted to be sufficiently accurate, and the non-volatile memory only stores one entry of data of the temperature code. When the temperature drifts and the second control word changes accordingly, the clock synthesizer is adjusted by the temperature compensated frequency controller in response to a change in the second control word.

In another embodiment, a method comprises: entering a calibration mode; generating a first control word to control a timing of a clock synthesizer; adjusting the first control word until the timing of the clock synthesizer is sufficiently accurate with respect to a timing of a reference clock; sensing a temperature using a temperature sensor; storing a present value of an output of the temperature sensor and the first control word into a non-volatile memory; exiting the calibration mode; entering a normal operation mode; sensing the temperature using the temperature sensor; generating a second control word to control the timing of the clock synthesizer in accordance with an output of the non-volatile memory and the output of the temperature sensor.

In one embodiment, a circuit for accurate clock synthesis comprises a clock synthesizer, a one-point calibration controller, a non-volatile memory, a temperature sensor, and a temperature compensated frequency controller.

In one embodiment, the clock synthesizer comprises an oscillator and a fractional-N phase-locked loop (PLL). The oscillator generates a self-sustained clock. The frequency of the oscillator's self-sustained clock is dependent on its total capacitance loadings. The fractional-N phase-locked loop receives an input clock that is derived from the self-sustained clock and a fractional control word to generate an accurate clock. The frequency of the accurate clock is equal to the multiplication of the frequency of its input clock and the value of the fractional control word.

In one embodiment, the clock synthesizer generates a first clock (the calibration clock) and a second clock (the accurate clock). The frequencies of the first clock and the second clock are denoted by $f_1$ and $f_2$, respectively. In one embodiment, the first clock (the calibration clock) is the input clock of the fractional-N phase-locked loop.

These and other features of the present invention will be readily apparent to persons of ordinary skill in the art upon reading the entirety of this disclosure, which includes the accompanying drawings and claims.

Figure 1:
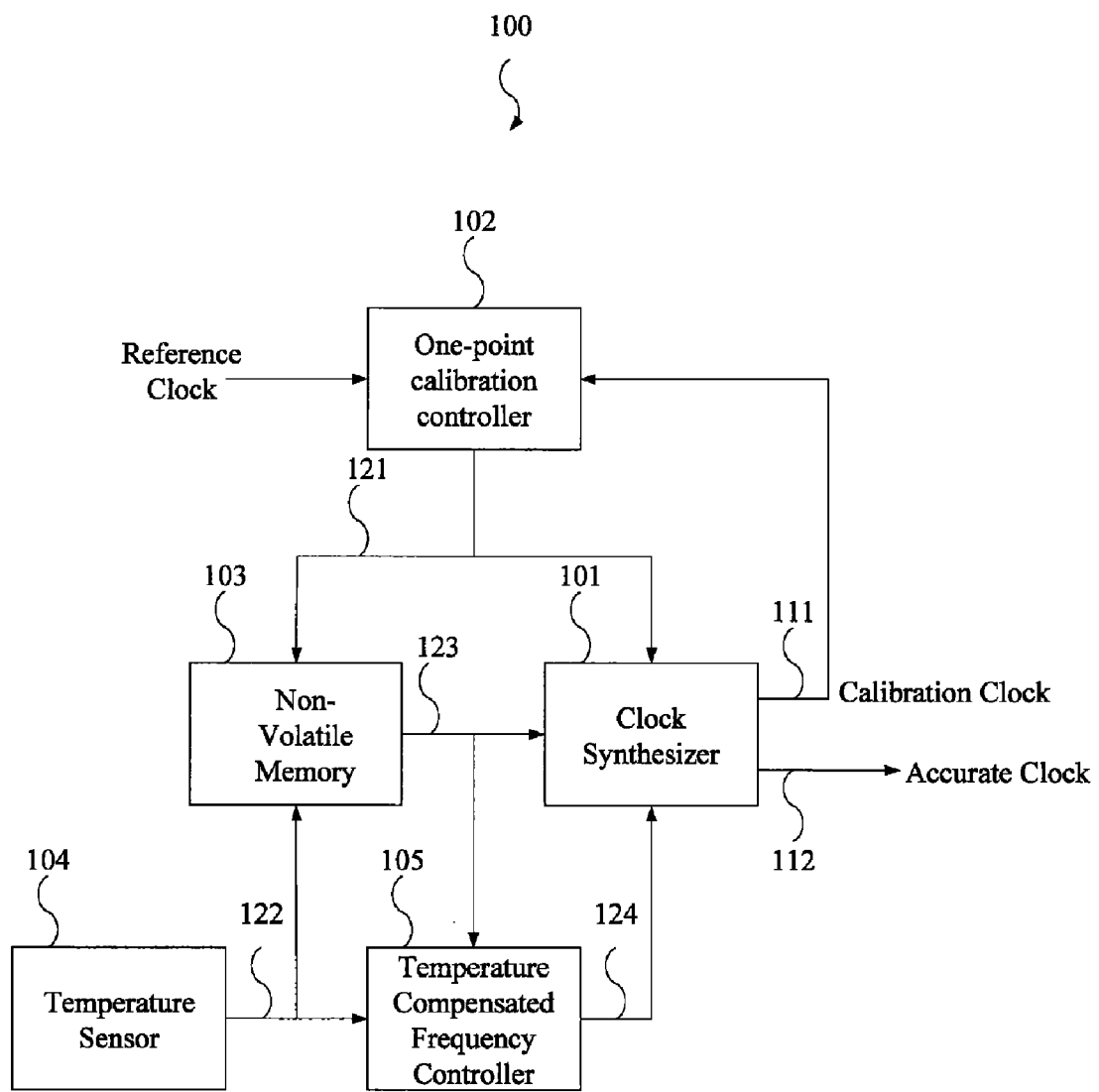
FIG. 1 shows a block diagram for the synthesis of an accurate clock in accordance with an embodiment of the present invention.

The use of the same reference label in different drawings indicates the same or like components.

DETAILED DESCRIPTION

In the present disclosure, certain details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Embodiments of the present invention advantageously allow for the synthesis of an accurate clock.

The one-point calibration controller receives an external reference clock and the first clock (the calibration clock) from the clock synthesizer and adjusts the frequency $f_1$ of the calibration clock to a frequency $G_1$ during a one-point calibration. The one-point calibration performs the calibration only once before the chip is shipped out to the customer. The calibration clock is derived from the oscillator's self-sustained clock. The one-point calibration controller generates a calibration adjustment word to configure the capacitances of the oscillator such that the frequency $f_1$ of the calibration clock is close to a specified frequency $G_1$ at a known voltage and a known temperature. At the same time, the temperature sensor measures the on-chip temperature and generates a current temperature word. Once the one-point calibration completes, the non-volatile memory stores the final calibration adjustment word and the current on-chip temperature word.

When the chip is powered on later, the non-volatile memory retrieves the stored information and generates a configuration setting word. The clock synthesizer configures the settings of the tuning elements by reading the configuration setting word. The temperature sensor continues monitoring the on-chip temperature and generates the current temperature word. The temperature compensated frequency controller receives the configuration setting word and the current temperature word and generates a fractional control word as an input of the clock synthesizer. The clock synthesizer receives the fractional control word and adjusts the frequency $f_2$ of the accurate clock accordingly. Ultimately the frequency of the accurate clock is maintained to within the required accuracies of a frequency $G_2$ over process, voltage, temperature variations.

In one embodiment, the circuit for clock synthesis is configured to generate a first digital word (the calibration adjustment word) from the one-point calibration controller, to generate a second digital word (the current temperature word) from the temperature sensor, to generate a third word (the configuration setting word) from the non-volatile memory, and to generate a fourth digital word (fractional control word) from the temperature compensated frequency controller.

The oscillator can be either a ring oscillator or a LC-tank oscillator. In one embodiment, the oscillator is a LC-tank oscillator. The frequency of the oscillator can be adjusted by changing the voltages of its tunable circuit elements. The tuning circuit elements can be any components and circuits, such as transistors or varactors. The capacitance of a tuning circuit element can be changed in a digital way or an analog way. When tuned in a digital way, the control input of a tuning circuit element, being a binary one or a binary zero, enables or disables the tuning circuit element, respectively, to exhibit a larger capacitance or a smaller capacitance. When tuned in an analog way, the value of the control input of a tuning circuit element, being an analog voltage, determines the capacitance of the tuning circuit element. In one embodiment, the capacitances of all tuning circuit elements in an oscillator are changed by their associated binary control signals. Such an oscillator is called a digitally controlled oscillator. In one embodiment, the oscillator is a digitally controlled oscillator.

The fractional-N phase-locked loop receives an input clock and a fractional control word and generates an accurate clock. The frequency of the accurate clock is equal to the frequency of the input clock and the value of the fractional control word. Therefore, the frequency of the accurate clock can be adjusted by changing the fractional control word. In one embodiment, the input clock is the first clock and the accurate clock is the second clock.

To maintain the frequency of the second clock over PVT variations, its frequency can be measured at each operation point over all process, voltage, and temperature corners. The frequency of the second clock can be adjusted accordingly by either changing the capacitance of the tuning circuit elements of the oscillator or the fractional control word of the fractional-N phase-locked loop.

In one embodiment, the frequency of the first clock (the calibration clock) from the clock synthesizer is only calibrated by the one-point calibration controller at a known supply voltage $V_1$ and a known temperature $T_1$ and then is adjusted to within the required accuracies of the frequency $G_1$. The one-point calibration controller generates the first digital word (the calibration adjustment word) to configure the capacitances of the oscillator during the one-point calibration. Once the one-point calibration completes, the first digital word (the calibration adjustment word) and the second digital word (the current temperature word) are stored into the non-volatile memory.

When the chip is powered on, the non-volatile memory retrieves the stored information and generates the third digital word (the configuration setting word). The clock synthesizer receives the third digital word (the configuration setting word) from the non-volatile memory to configure its tuning circuit elements. The tuning configuration in the third digital word is used to enable or disable the tuning circuit elements of the oscillator accordingly. In doing so, the frequency difference of the frequency $f_1$ and the frequency $G_1$ due to process variations at the known supply voltage $V_1$ and the known temperature $T_1$ is reduced to a very small, almost to a negligible amount. If the fractional control word of the fractional-N PLL is set to the default division ratio $$DIV\left(=\frac{G_2}{G_1}\right),$$

the frequency of the second clock is also equal to the frequency $G_2$ at the known supply voltage $V_1$ and the known temperature $T_1$.

As the on-chip temperature changes, the frequency of the oscillator's self-sustained clock differs from its specified frequency $G_1$. Consequently the frequency of the second clock (the accurate clock) deviates from its specified frequency $G_2$. In order to maintain the frequency of the second clock to within the required accuracies of the frequency $G_2$, the temperature sensor measures the on-chip temperature $T_2$ to generate the second word (the current temperature word). The temperature compensated frequency controller receives the second word (the current temperature word) and the third word (the configuration setting word) and generates the fourth digital word (the fractional control word) to adjust the frequency of the accurate clock. In order to bring the frequency $f_2$ back to the frequency $G_2$, the fractional control word has to be changed from its default division ratio.

In one embodiment, the temperature compensated frequency controller comprises a frequency error estimator and a division ratio generator. The frequency error estimator estimates the frequency deviation ratio. The frequency deviation ratio is defined as $(G_1/f_1-1)$. The division ratio generator receives the estimate of the frequency deviation ratio and generates the fourth digital word (the fractional control word).

In one embodiment, the frequency error estimator comprises a linear predictor and a lookup table. The output of the linear predictor is the linear prediction of the frequency deviation ratio of the frequency $G_1$ to the frequency $f_1$ that is defined as $(G_1/f_1-1)$. The linear predictor can use tuning configuration settings stored in the third digital word (the configuration setting word) to determine a temperature sensitivity $$\frac{\partial f_1}{\partial T}$$

of the first clock and multiplies the $$\frac{\partial f_1}{\partial T}$$

with the temperature difference of the on-chip temperature $T_2$ and the known temperature $T_1$ to obtain the linear prediction. The on-chip temperature $T_2$ is from the second digital word (the current temperature word) and the known temperature $T_1$ is from the third digital word (the configuration setting word). Any nonlinear deviation that is equal to the difference of the frequency deviation ratio and the linear prediction is stored in the lookup table and can be indexed by the temperature difference of $(T_2-T_1)$. The entries in the lookup table can be pre-calculated and stored. The summation of the output of the linear predictor $$\frac{\partial f_1}{\partial T}\cdot(T_2-T_1)$$

and the output of the lookup table, denoted as $LUT(T_2-T_1)$, is an estimate of the frequency deviation ratio. The estimated frequency deviation ratio is expected to be as close to $(G_1/f_1-1)$ as possible.

In one embodiment, the division ratio generator receives the estimate of the frequency deviation ratio from the frequency error estimator and generates the fourth digital word (the fractional control word). The multiplication of the estimated frequency deviation ratio and the default division ratio $$DIV\left(=\frac{G_2}{G_1}\right)$$

results in an estimate of the deviated division ratio, $$\left(\frac{\partial f_1}{\partial T}\cdot(T_2-T_1)+LUT(T_2-T_1)\right)\cdot DIV.$$

The deviated division ratio, represents the difference of the required division ratio in the fractional-N PLL and the default division ratio. The summation of the deviated division ratio and the default division ratio results in the fourth digital word (the fractional control word).

Since the value of the fourth digital word is very close to $G_1/f_1 \cdot DIV$ and the frequency of the first clock is $f_1$, the multiplication of the fourth digital word and the frequency of the first clock is very close to $G_1 \cdot DIV$. Because DIV is $$\frac{G_2}{G_1},$$

the frequency of the synthesized clock is very close to $G_2$. The temperature compensated frequency controller compensates the frequency deviation of the first clock from the specified frequency $G_1$ by changing the fractional control word of the fractional-N phase-locked loop such that the frequency of the second clock is very close to $G_2$.

Due to the binary nature of the tuning circuit elements of a digitally controlled oscillator, its oscillation frequency shows much less fluctuations against the variations of the supply voltage. The frequency changes of an oscillator can be further reduced by employing a digitally controlled oscillator. In one embodiment, the oscillator used for accurate clock synthesis is a digitally controlled oscillator.

FIG. 1 shows a block diagram of a circuit 100 for the synthesis of an accurate clock in accordance with an embodiment of the present invention. In one embodiment, the circuit 100 for accurate clock synthesis comprises a clock synthesizer 101, a one-point frequency controller 102, a non-volatile memory 103, a temperature sensor 104, and a temperature compensated frequency controller 105. The circuit 100 is configured to receive a reference clock during the calibration and to generate an accurate clock.

Figure 2:
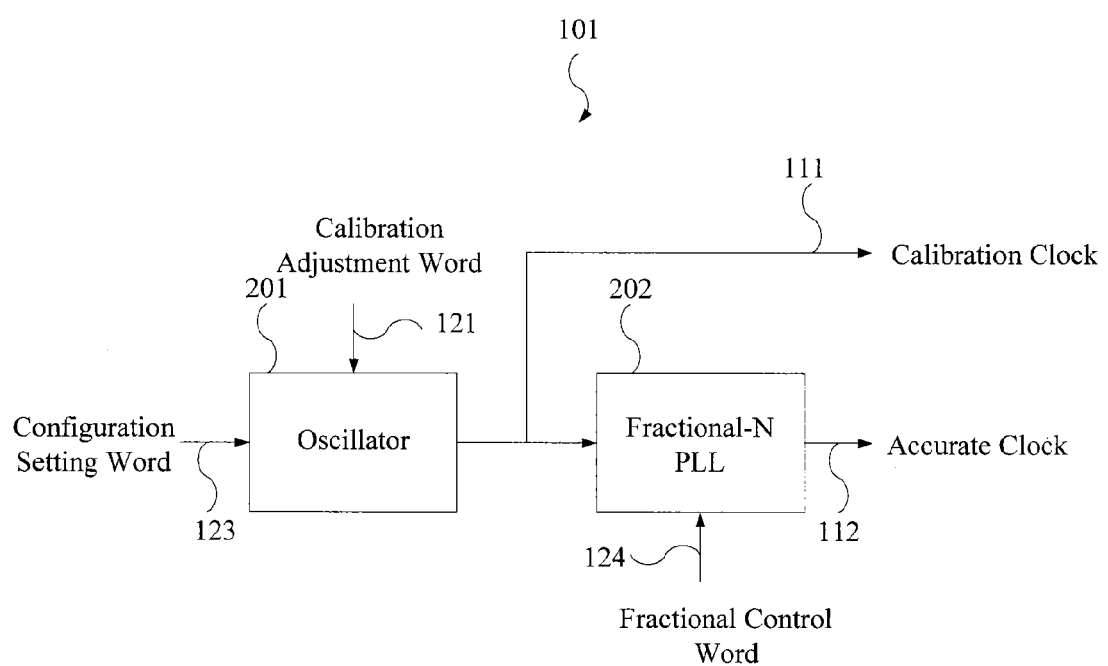
FIG. 2 schematically shows a clock synthesizer in accordance with an embodiment of the present invention.

FIG. 2 shows a block diagram of the clock synthesizer 101 in accordance with an embodiment of the present invention. The clock synthesizer 101 comprises an oscillator 201 and a fractional-N phase-locked loop (PLL) 202. The oscillator 201 generates a self-sustained clock. The frequency of the oscillator's self-sustained clock is dependent on its total capacitance loadings. In one embodiment, the oscillator's self-sustained clock is the calibration clock. The clock synthesizer is configured to receive a calibration adjustment word 121, a configuration setting word 123, and a fractional control word 124 and to generate a calibration clock and an accurate clock.

The frequencies of the calibration clock and the accurate clock are denoted by $f_1$ and $f_2$, respectively. The circuit 100 for accurate clock synthesis is configured to generate a first clock (the calibration clock) 111 and a second clock (the accurate clock) 112 from the clock synthesizer 101.

In one embodiment, the first clock (the calibration clock) is the input clock of the fractional-N phase-locked loop. The fractional-N phase-locked loop receives the calibration clock and the fractional control word to generate the accurate clock. The frequency of the accurate clock is equal to the multiplication of the frequency of the calibration clock and the value of the fractional control word. The frequency of the accurate clock needs to be maintained within the required accuracies of a frequency $G_2$ over process, voltage, and temperature variations.

The frequency $f_1$ of the first clock 111 is calibrated at a known supply voltage $V_1$ and a known temperature $T_1$ by using the one-point calibration controller 102. In one embodiment, the one-point calibration controller 102 is configured to receive an external reference clock and the first clock (the calibration clock) and to generate a calibration adjustment word 121 during the one-point calibration. The clock synthesizer 101 receives the calibration adjustment word 121 to change the settings of the tuning circuit elements of the oscillator 201 during the one-point calibration. During the calibration, the temperature sensor measures the on-chip temperature $T_1$ and generates a current temperature word 122. Once the one-point calibration completes, the frequency of the first clock (the calibration clock) is very close a frequency $G_1$ and the non-volatile memory stores the final calibration adjustment word and calibrated temperature word ($T_1$).

The one-point calibration performs the calibration only once before the chip is shipped out to the customer. Therefore the one-point calibration controller 102 is no longer used and the reference clock is not longer needed after the one-point calibration completes.

When the chip is powered on, the non-volatile memory 103 retrieves the stored information and generates a configuration setting word 123. The clock synthesizer receives the configuration setting word from the non-volatile memory 103 to configure the tuning circuit elements of the oscillator 201. The tuning information in the configuration setting word is used to enable or disable the tuning circuit elements of the oscillator accordingly. In doing so, the frequency difference of the frequency $f_1$ and the frequency $G_1$ due to process variations at the known supply voltage $V_1$ and the known temperature $T_1$ is reduced to a very small, almost to a negligible amount. If the fractional control word of the fractional-N PLL is set to the default division ratio $$DIV\left(=\frac{G_2}{G_1}\right),$$

the frequency of the second clock is close to the frequency $G_2$ at the known supply voltage $V_1$ and the known temperature $T_1$.

However, the frequency of the first clock 111 is still sensitive to the on-chip temperature variations. To maintain the frequency accuracy against the variations of the on-chip temperature, the temperature sensor 104 is employed to sense the on-chip temperature $T_2$ and generate a current temperature reading. The temperature compensated frequency controller 105 is configured to receive the configuration setting word and the current temperature word and to generate a fractional control word to adjust the frequency of the second clock based on the known temperature $T_1$ and the current temperature $T_2$. The fractional control word representing a sum of the default division ratio and an estimated deviated division ratio is connected to the fractional-N phase-locked loop 202 to synthesize the frequency of the second clock. The frequency $f_2$ of the second clock is then equal to the multiplication of the frequency $f_1$ of the first clock and the value of the fractional control word. At the known supply voltage and the known temperature $T_1$, the value of a fractional control word is equal to its default value DIV.

The circuit 100 for the synthesis of an accurate clock is thus configured to generate a first digital word 121 (the calibration adjustment word) from the one-point calibration controller 102, to generate a second digital word 122 (the current temperature word) from the temperature sensor 104, to generate a third digital word 123 (the configuration setting word) from the non-volatile memory 103, and to generate a fourth digital word 124 (fractional control word) from the temperature compensated frequency controller.

In one embodiment, the oscillator is a digitally controlled oscillator in accordance with an embodiment of the present invention. Due to the binary nature of the tuning circuit elements of a digitally controlled oscillator, its oscillation frequency shows much less fluctuations over voltage variations.

Figures 3A, 3B:
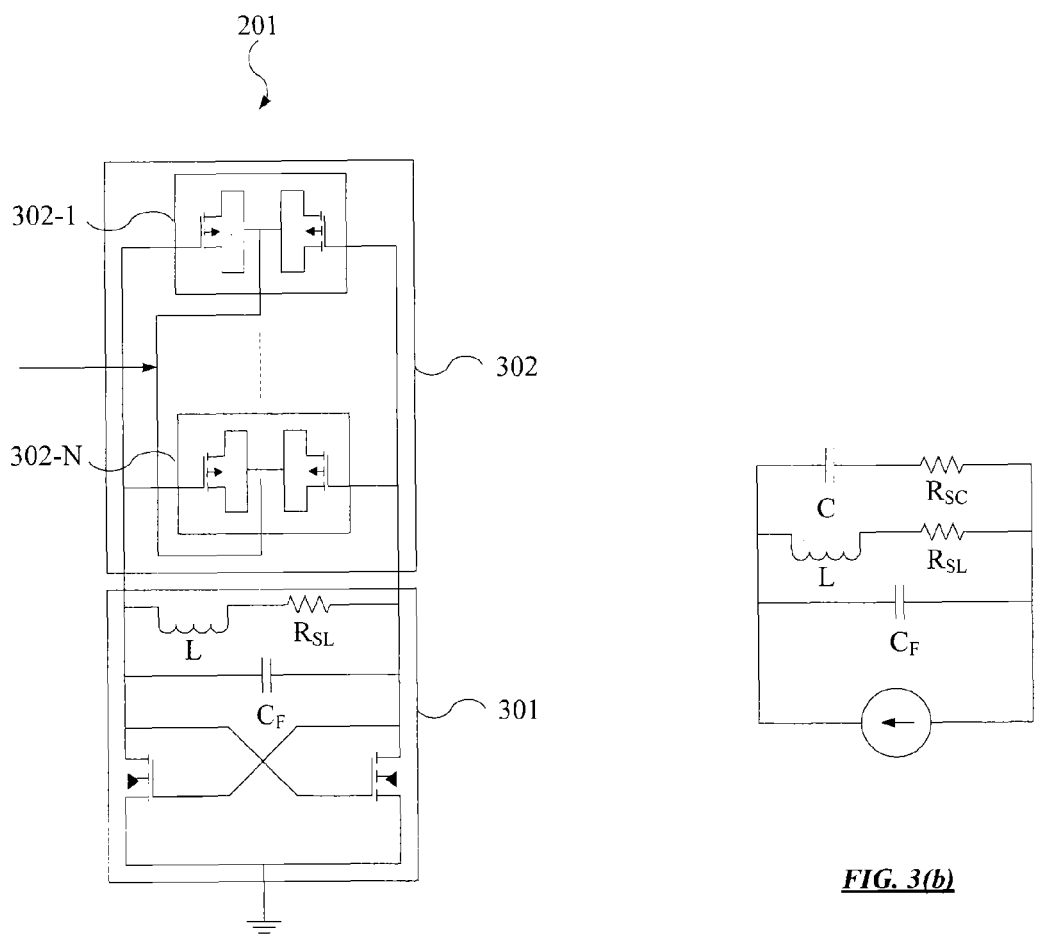
FIG. 3(a) schematically shows a digitally controlled oscillator in accordance with an embodiment of the present invention.
FIG. 3(b) schematically shows an equivalent circuit of the digitally controlled oscillator in FIG. 3(a)
Figure 4:
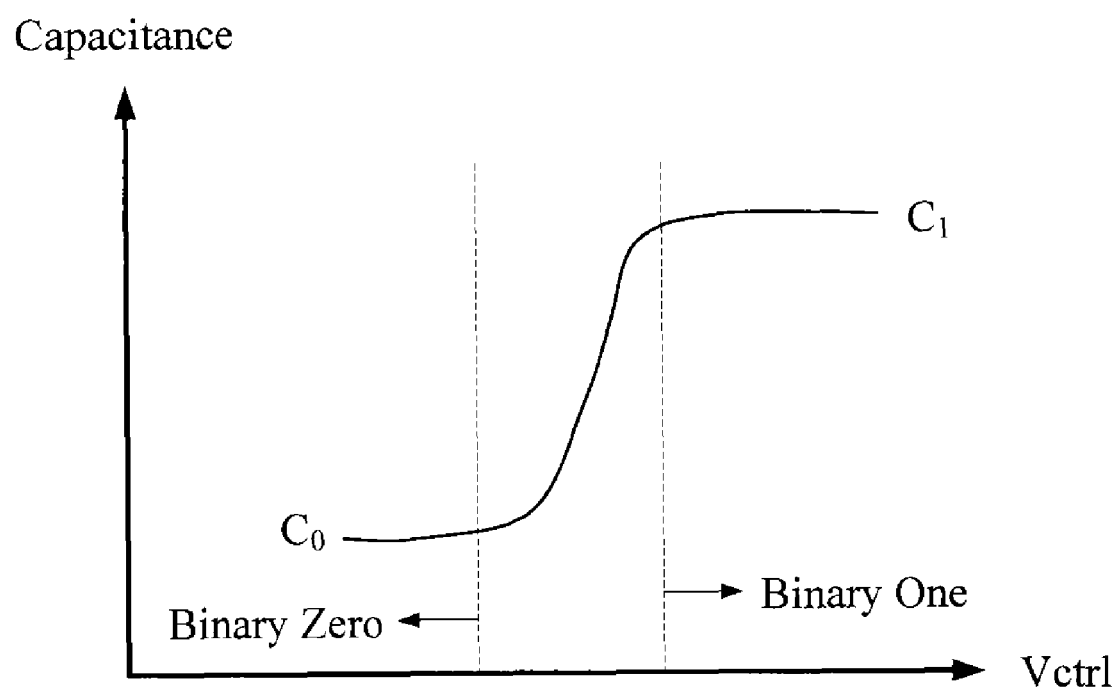
FIG. 4 shows a capacitance versus voltage curve of its associated control signal of a tuning circuit element in accordance with an embodiment of the present invention.

FIG. 3(a) is a block diagram of a digitally controlled oscillator 201. The digitally controlled oscillator is constructed from a LC-tank 301 and a plurality of N tuning circuit elements 302. The tuning circuit element can be any components and circuits, such as transistors, varactors, or a metal insulated metal capacitor. Each tuning circuit element has an associated digital control signal. A tuning circuit element is enabled and has a capacitance $C_1$ when its associated control signal is equal to a binary one. A tuning circuit element is disabled and has a capacitance $C_0$ when its associated control signal is equal to a binary zero. FIG. 4 shows a capacitance versus voltage curve of its associated control signal of a tuning circuit element in accordance with an embodiment of the present invention.

An equivalent electrical circuit of the digitally controlled oscillator is shown in FIG. 3(b). The oscillation frequency of the digitally controlled oscillator 201 is determined by L (the inductance in the LC-tank 301), $R_{SL}$ (inductor loss in LC-tank 301), $C_F$ (the capacitance in the LC-tank 301), C (the sum of all the capacitance values of the tuning circuits), and $R_{SC}$ (the capacitor loss of the tuning circuits). The oscillation frequency is roughly equal to $$\frac{1}{(2\pi\sqrt{L(C_F+C)})} \cdot \sqrt{\frac{L-(C_F+C)\cdot R_{SL}^2}{L-C^2/(C_F+C)\cdot R_{SC}^2}}.$$

In most cases, the capacitor loss is smaller compared to the inductor loss. Therefore the oscillation frequency can be further simplified to $$\frac{1}{(2\pi\sqrt{L(C_F+C)})} \cdot \sqrt{1-\frac{(C_F+C)\cdot R_{SL}^2}{L}}.$$

Figure 5:
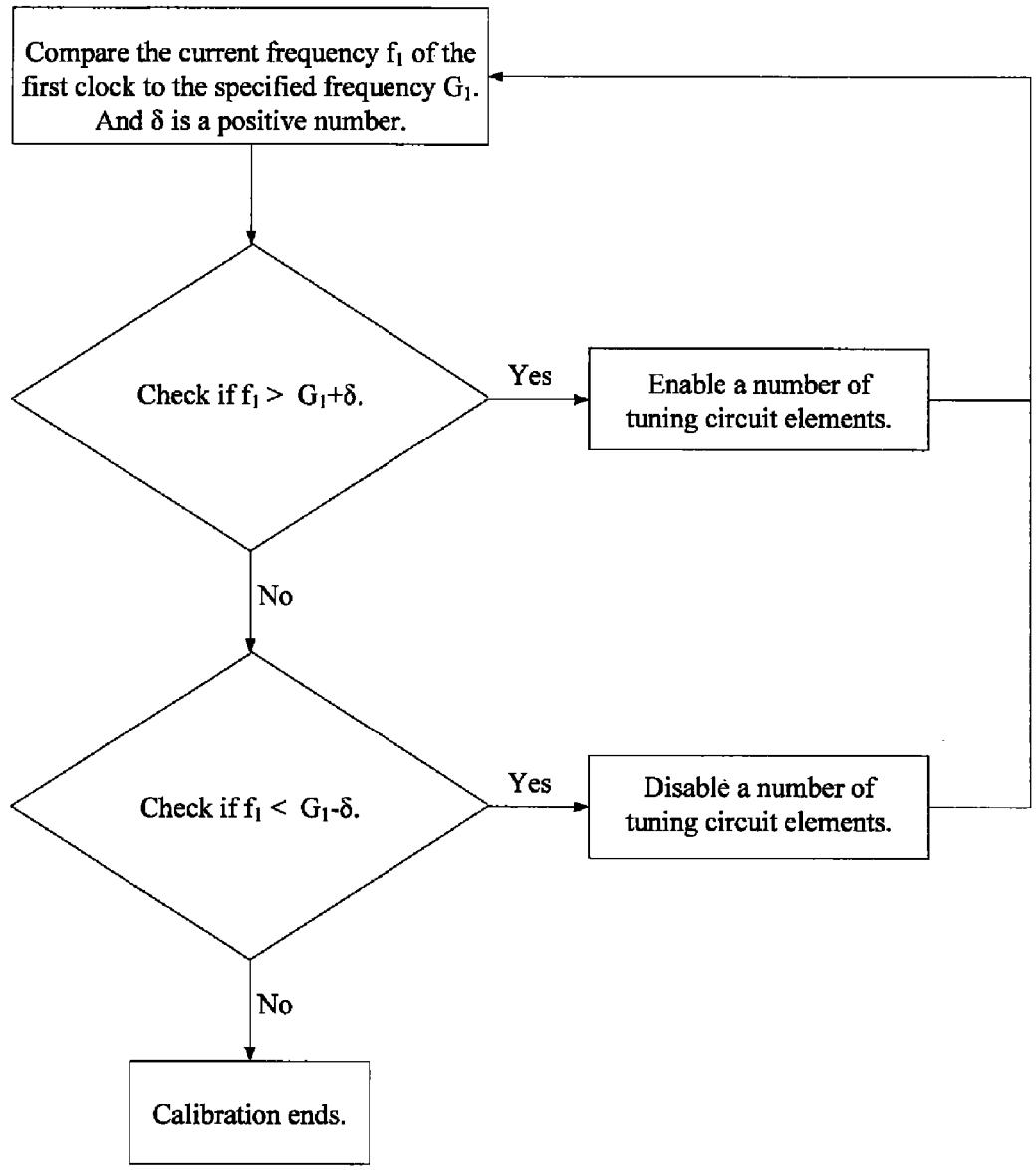
FIG. 5 shows a method to calibrate the frequency of a calibration clock with respect to a specified frequency and adjust the frequency of the calibration clock by changing the settings of the tuning circuit elements in accordance with an embodiment of the present invention.

FIG. 5 shows an algorithm used in the calibration to adjust the frequency $f_1$ of the first clock to within the required accuracies of the frequency $G_1$. The frequency $G_1$ is derived from the frequency of the reference clock. The method first compares the frequencies of the first clock with the frequency $G_1$. If the current frequency of the first clock is greater than required accuracies of the frequency $G_1$, enable a number of tuning circuit elements to reduce the frequency of the first clock. If not, check if the current frequency of the first clock is less than the required accuracies of the frequency $G_1$. If yes, disable a number of tuning circuit elements to increase the frequency of the first clock. If not, the calibration ends and the configurations of the tuning circuit elements and the known temperature $T_1$ are saved into the non-volatile memory 103.

If the fourth digital word (the fractional control word) of the fractional-N PLL is set to its default division value $$DIV\left(=\frac{G_2}{G_1}\right),$$

the frequency $f_2$ of the second clock can be adjusted to within the required accuracies of the frequency $G_2$ at the known supply voltage $V_1$ and the known temperature $T_1$. However, the frequency of the oscillator's self-sustained clock is sensitive to the variations of the on-chip temperature. The inductance L in the LC-tank 301, the capacitor $C_F$ in the LC-tank 301, and the capacitor C of tuning circuits generally show less changes as the temperature changes. However, the inductor loss is strongly dependent on the temperature. The temperature coefficient of an inductor loss is dependent on the material used. The temperature sensitivity $$\frac{\partial f_1}{\partial T}$$

of the frequency of the first clock can then be calculated as $$-\frac{f_0^2}{f_1} \cdot \frac{(C_F+C)\cdot R_{SL}}{L} \cdot \frac{\partial R_{SL}}{\partial T} \text{ where } f_0 = \frac{1}{2\pi\sqrt{L(C_F+C)}}.$$

The frequency drift of the first clock leads to the frequency change of the second clock if the fractional control word is kept at its default value DIV. To compensate the frequency drift due to the temperature change, the temperature sensor 104 is first used to measure the on-chip temperature $T_2$.

Figure 6:
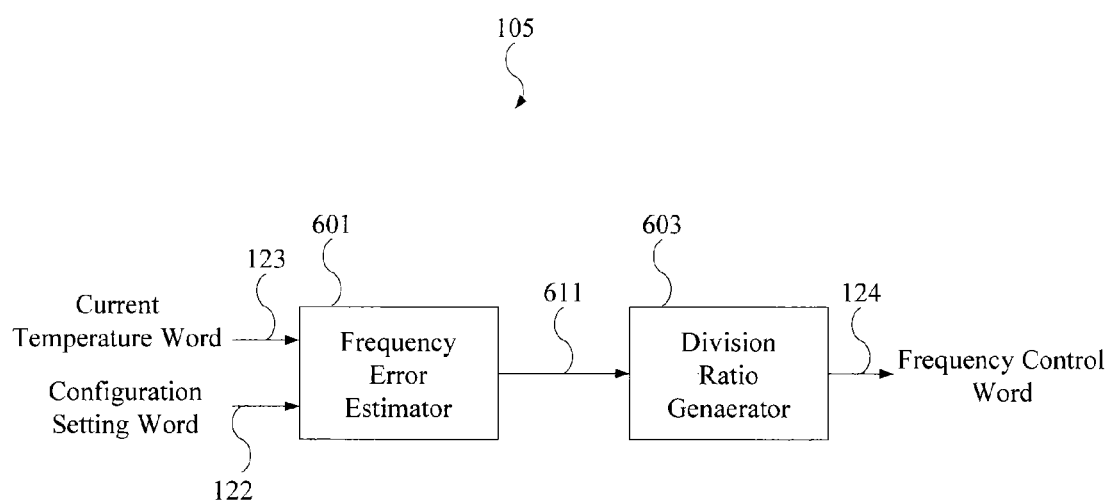
FIG. 6 shows a block diagram of a temperature compensated frequency controller by adapting the division ratio of a fractional-N PLL as the temperature changes in accordance with an embodiment of the present invention.

FIG. 6 shows a block diagram of a temperature compensated frequency controller 105 in accordance with an embodiment of the present invention. The temperature compensated frequency controller 105 is configured to receive the second digital word (the current temperature word) and the third digital word (configuration setting word) and to generate the fourth digital word (fractional control word). The temperature compensated frequency controller 105 comprises a frequency error estimator 601 and a division ratio generator 603. The frequency error estimator 601 estimates the frequency deviation ratio. The frequency deviation ratio is defined as $(G_1/f_1-1)$. The division ratio generator 603 receives the estimate of the frequency deviation ratio and generates the fourth digital word (the fractional control word).

Figure 7A:
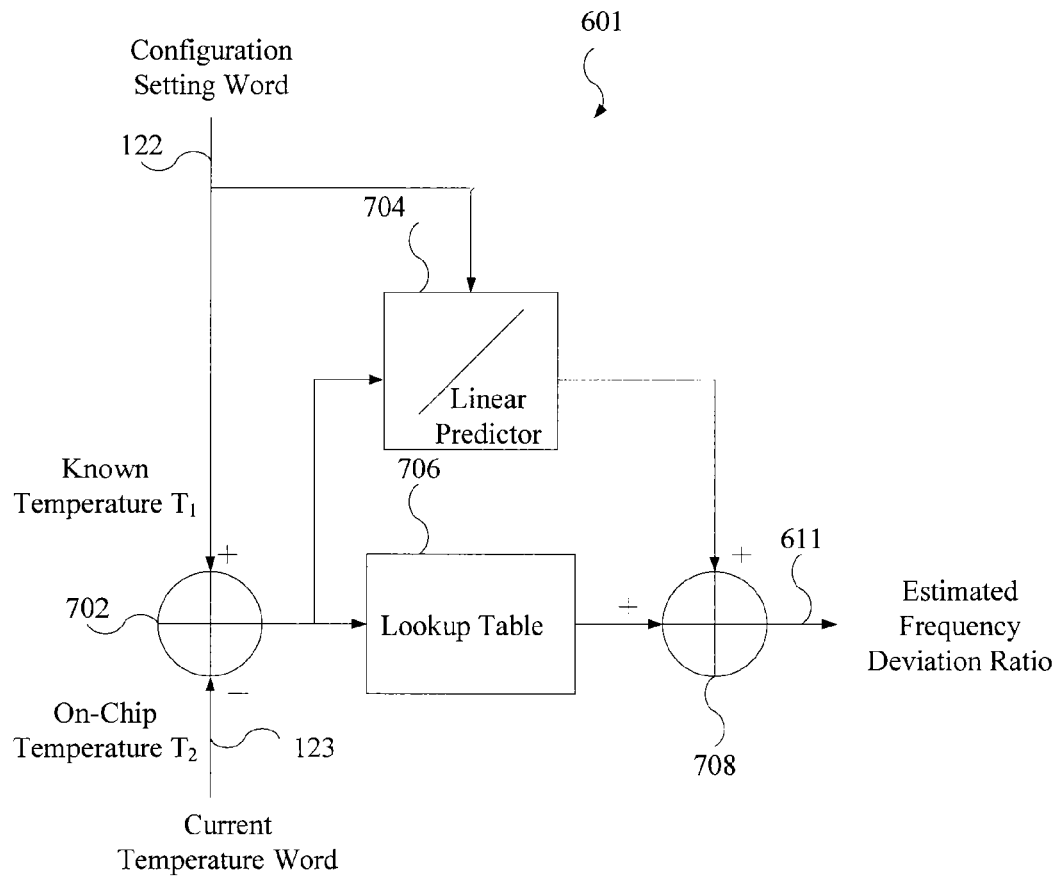
FIG. 7(a) shows a block diagram of a frequency error estimator in PLL in accordance with an embodiment of the present invention.

FIG. 7(a) shows a block diagram of a frequency error estimator 601 in accordance with an embodiment of the present invention. The frequency error estimator 601 is configured to receive the second digital word (the current temperature word) and the third digital word (the configuration setting word) and to generate an estimate of the frequency deviation ratio. The frequency error estimator 601 comprises an adder 702, a linear predictor 704, a lookup table 706, and another adder 708.

The output of the linear predictor 704 is the linear prediction of the frequency deviation ratio. The linear predictor 704 uses tuning configuration settings stored in the third digital word (the configuration setting word) to determine a temperature sensitivity of the first clock and multiplies the $$\frac{\partial f_1}{\partial T}$$

with the temperature difference of the on-chip temperature $T_2$ and the known temperature $T_1$ to obtain the linear prediction. As mentioned earlier, the temperature sensitivity $$\frac{\partial f_1}{\partial T}$$

of the frequency of the first clock is $$-\frac{f_0^2}{f_1} \cdot \frac{(C_F + C) \cdot R_{SL}}{L} \cdot \frac{\partial R_{SL}}{\partial T}.$$

It can be easily seen from the equation that the temperature sensitivity of the frequency of the first clock is strongly dependent on the capacitance value of the tuning circuit C. Therefore, the temperature sensitivity is determined by inspecting the configuration settings of the tuning circuit elements stored in the non-volatile memory 103. The adder 702 calculates the temperature difference of the on-chip temperature $T_2$ and the known temperature $T_1$. The output of the linear predictor, $$\frac{\partial f_1}{\partial T} \cdot (T_2 - T_1),$$

is the linear prediction.

Any nonlinear deviations that is equal to the difference of the frequency deviation ratio $(G_1/f_1 - 1)$ and the linear prediction $$\frac{\partial f_1}{\partial T} \cdot (T_2 - T_1)$$

are stored in the lookup table 706 and can be indexed by the temperature difference of $(T_2-T_1)$. The output of the lookup table is denoted as $LUT(T_2-T_1)$. The entries in the lookup table can be pre-calculated. The adder 708 is configured to sum the output of the linear predictor 704 and the output of the lookup table 706. The summation of the output of the linear predictor and the output of the lookup table is an estimate of the frequency deviation ratio. The estimated frequency deviation ratio is expected to be as close to $(G_1/f_1 - 1)$ as possible.

Figure 7B:
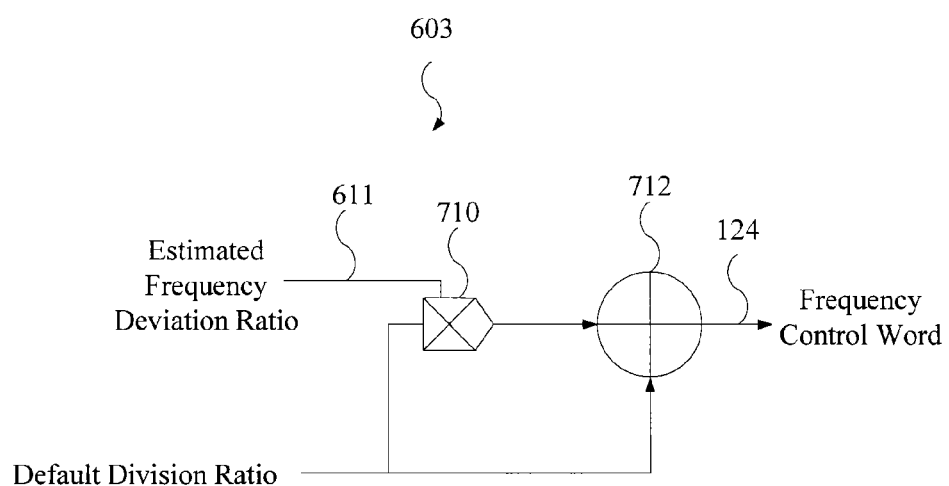
FIG. 7(b) shows a block diagram of a division ratio generator in PLL in accordance with an embodiment of the present invention.

FIG. 7(b) shows a block diagram of a division ratio generator 603 in accordance with an embodiment of the present invention. The frequency error estimator 601 is configured to receive the estimate of the frequency deviation ratio and to generate the fourth digital word (the fractional control word) to adjust the frequency of the second clock. The frequency error estimator 601 comprises a multiplier 710 and an adder 712.

The multiplier 710 is configured to multiply the estimate of the frequency deviation ratio and the default division ratio DIV. The multiplication is an estimate of the deviated division ratio. The adder 712 is configured to add the estimate of the deviated division ratio and the default division ratio and to generate the fourth digital word (the fractional control word).

The fractional-N phase-locked loop 202 receives the first clock and the fourth digital word (the fractional control word) and to generate the second clock. In this embodiment, the frequency $f_2$ of the second clock is equal to the multiplication of the frequency $f_1$ of the first clock and the value of the fourth digital word. Since the value of the fourth digital word is very close to $G_1/f_1 \cdot DIV$, the multiplication of the frequency $f_1$ and the fourth digital word synthesizes a clock whose frequency is very close to $G_1 \cdot DIV$.

The value of $G_1 \cdot DIV$ is equal to $G_2$ because DIV is equal to $$\frac{G_2}{G_1}.$$

Figure 8:
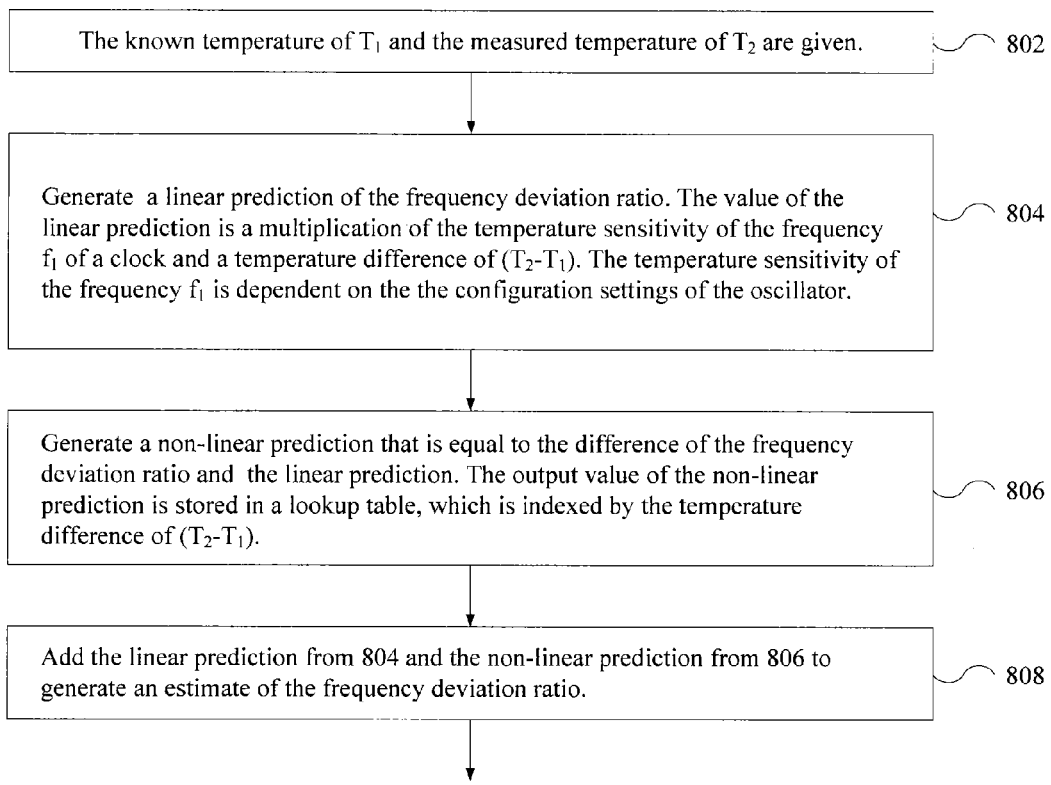
FIG. 8 shows a method to generate an estimate of the frequency deviation ratio in accordance with an embodiment of the present invention.

FIG. 8 shows a method to generate an estimate of the frequency deviation ratio of $(G_1/f_1 - 1)$ in accordance with an embodiment of the present invention. The method starts with the measurement of the current on-chip temperature $T_2$ and the known temperature $T_1$. Then a linear prediction of the frequency deviation ratio is generated. The output value of the linear prediction is a multiplication of the temperature sensitivity $$\frac{\partial f_1}{\partial T}$$

of the frequency of the first clock and a temperature difference of $(T_2-T_1)$. The temperature sensitivity is dependent on the configuration settings of the tuning circuit elements that are stored in the third digital word. Any non-linear deviation that is equal to the difference of the frequency deviation ratio and the linear prediction is also generated. The output value of the non-linear prediction is stored in a lookup table, which is indexed by the temperature difference of $(T_2-T_1)$. Add the linear prediction from 804 and the non-linear prediction from 806 is an estimate of the frequency deviation ratio.

Methods and apparatus for accurate clock synthesis have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus comprising:
   a clock synthesizer for outputting a first clock in accordance with a first control word during an initial calibration and outputting a second clock in accordance with a combination of a third control word and a fourth control word during a normal operation;
   a temperature sensor for outputting a second control word representing a temperature of the apparatus;
   a non-volatile memory for storing and outputting the third control word;
   a temperature compensated frequency controller for receiving the second control word and the third control word and outputting the fourth control word; and
   a one-point calibration controller for outputting the first control word, wherein: during the initial calibration, the one-point calibration controller adjusts the first control word until a timing of the first clock is sufficiently accurate with respect to a timing of a reference clock, and upon the first clock being sufficiently accurate the calibration controller stores a present value of the first control word and the second control word into the non-volatile as the third control word; and during the normal operation, the one-point calibration controller is disabled, the non-volatile memory is in a read-only state, and the temperature compensated frequency controller adjusts the fourth control word in response to a change in the second control word.

2. The apparatus of claim 1, wherein the clock synthesizer comprises an oscillator for outputting the first clock.

3. The apparatus of claim 2, wherein the oscillator comprises an inductor and a plurality of capacitors, each capacitor being controlled by a respective bit of the first control word during the initial calibration and controlled by a respective bit of the third control word during the normal operation.

4. The apparatus of claim 3, wherein each of said capacitors exhibits a first capacitance when the respective bit is of a first logical value and exhibits a second capacitance where the respective bit is of a second logical value.

5. The apparatus of claim 2, wherein the clock synthesizer further comprises a fractional-N phase lock loop for outputting the second clock by locking to the first clock in accordance with the fourth control word.

6. The apparatus of claim 5, wherein a ratio of a frequency of the second clock to a frequency of the first clock is determined by the fourth control word.

7. The apparatus of claim 1, wherein the temperature compensated frequency controller comprises a linear predictor for outputting a first intermediate word in accordance with the second control word and the third control word.

8. The apparatus of claim 7, wherein the temperature compensated frequency controller further comprises a lookup table for outputting a second intermediate word in accordance with the second control word and the third control word.

9. The apparatus of claim 8, wherein a third intermediate word is obtained by summing the first intermediate word and the second intermediate word.

10. The apparatus of claim 9, wherein the fourth control word is a combination of the third intermediate word and a fixed word.

11. A method for controlling a timing apparatus, the method comprising:
entering a calibration mode;
generating, while in the calibration mode, a first control word to control a timing of a clock synthesizer;
adjusting the first control word until the timing of the clock synthesizer is sufficiently accurate with respect to a timing of a reference clock;
sensing, while in the calibration mode, a calibration temperature using a temperature sensor;
storing a present value of an output of the first control word into a non-volatile memory;
exiting the calibration mode;
entering a normal operation mode;
sensing, while in normal operation mode, a normal operation temperature using the temperature sensor;
generating, while in normal operation mode, a second control word to control the timing of the clock synthesizer in accordance with an output of the non-volatile memory and the output of the temperature sensor.

12. The method of claim 11, wherein: the clock synthesizer comprises an oscillator, a timing of the oscillator being controlled by the first control word, the timing of the oscillator determining the timing of the clock synthesizer when the clock synthesizer is in the calibration mode.

13. The method of claim 12, wherein the oscillator comprises an inductor and a plurality of capacitors, each capacitor being controlled by a respective bit of the first control word in the calibration mode and controlled by a respective bit of the second control word in a normal mode.

14. The method of claim 13, wherein each of said capacitors exhibits a first capacitance when the respective bit is of a first logical value and exhibits a second capacitance when the respective bit is of a second logical value.

15. The method of claim 12, wherein the clock synthesizer further comprises a fractional-N phase lock loop for outputting a clock by locking to an output of the oscillator in accordance with the second control word.

16. The method of claim 15, wherein a ratio of a frequency of the clock to a frequency of the output of the oscillator is determined by the second control word.

17. The method of claim 11, wherein generating the second control word comprises performing a linear predictor to generate a first intermediate word in accordance with the first control word and a temperature code.

18. The method of claim 17, wherein generating the second control word further comprises performing a table lookup to generate a second intermediate word in accordance with the first control word and the temperature code.

19. The method of claim 18 further comprising summing the first intermediate code and the second intermediate word to generate a third intermediate word.

20. The method of claim 19 further comprising generating the second control word based on a combination of the third intermediate word and a fixed word.

* * * * *